(12) United States Patent
Jensen

(10) Patent No.: US 7,310,056 B2
(45) Date of Patent: Dec. 18, 2007

(54) METHOD AND SYSTEM FOR ADJUSTABLE SAMPLE RATE CONVERSION

(75) Inventor: Henrik Tholstrup Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 345 days.

(21) Appl. No.: 11/176,417

(22) Filed: Jul. 7, 2005

(65) Prior Publication Data

US 2007/0008198 A1    Jan. 11, 2007

(51) Int. Cl.
*H03M 7/00* (2006.01)
(52) U.S. Cl. ......................................... 341/61; 341/143
(58) Field of Classification Search ................ 341/143, 341/61; 375/219; 708/312
See application file for complete search history.

(56) References Cited

U.S. PATENT DOCUMENTS

| | | | | |
|---|---|---|---|---|
| 4,725,972 A * | 2/1988 | Gockler | ...................... | 708/313 |
| 5,732,107 A * | 3/1998 | Phillips et al. | ............... | 375/296 |
| 5,880,980 A * | 3/1999 | Rothacher et al. | .......... | 708/313 |
| 5,916,301 A * | 6/1999 | Rothacher | .................... | 708/312 |
| 6,061,704 A * | 5/2000 | Ostman et al. | ............. | 708/313 |
| 6,570,935 B1* | 5/2003 | Sugita | ......................... | 375/324 |
| 6,870,492 B1* | 3/2005 | Jensen | .......................... | 341/61 |
| 2005/0207480 A1* | 9/2005 | Norsworthy et al. | ........ | 375/219 |

* cited by examiner

*Primary Examiner*—Peguy JeanPierre
(74) *Attorney, Agent, or Firm*—McAndrews, Held & Malloy, Ltd.

(57) ABSTRACT

Described herein is a method and system for sampling rate conversion. A clamped cubic spline interpolator (CCSI) may be utilized to interpolate or decimate a source signal to provide samples at times based on a sink rate. The source clock and sink clock may be driven by independent oscillators, and may therefore drift independently. A rate tracking algorithm may monitor the relative drift and adjust the conversion of the source signal to track the sink rate.

19 Claims, 10 Drawing Sheets

METHOD AND SYSTEM FOR ADJUSTABLE SAMPLE RATE CONVERSION

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal processing. More specifically, certain embodiments of the invention relate to a method and system for sample rate conversion.

BACKGROUND OF THE INVENTION

In a digital signal processing application, different techniques may be utilized to convert from one sampling rate to another sampling rate. For example, a digital signal sampled at a first rate may be converted into an analog signal using a digital-to-analog converter (DAC), and the analog signal may then be sampled at a second rate using an analog-to-digital converter (ADC). However, this conversion may be costly and may create distortion that degrades the quality of the resulting signal to a degree that renders the method unusable for some applications.

Another sampling rate conversion technique may interpolate and decimate a digital signal. The digital signal may be interpolated from a first rate to a multiple of the first rate. Decimation may then be applied to produce a second rate. U.S. Pat. No. 6,870,492, entitled Method of Near-unity Fractional Sampling Rate Alteration for High Fidelity Digital Audio, provides a method of efficiently converting the sampling rate of a digital signal from a first sampling rate to a second sampling rate that is only slightly different than the first sampling rate.

A digital system may comprise multiple clock domains generated by independent oscillators. Oscillators may vary with time, temperature, and age, and if this variation causes sampling rates to drift with respect to each other, the drift may alter further processing such as circuits that rely directly or indirectly on the oscillator clock. A sample rate conversion that is based on a fixed ratio between the sample rates may fail to track this type of change.

Limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Described herein are system(s) and method(s) for sample rate adaptation, substantially as shown in and/or described in connection with at least one of the figures, as set forth more completely in the claims.

These and other advantages and novel features of the present invention will be more fully understood from the following description.

DETAILED DESCRIPTION OF THE INVENTION

Certain embodiments of the invention may be found in a method and system for sample rate conversion. In accordance with one embodiment of the invention, a clamped cubic spline interpolator (CCSI) may be utilized to interpolate or decimate a source signal to provide samples at times based on a sink rate. The source clock and sink clock may be driven by independent oscillators, and may therefore drift independently. A rate tracking algorithm may monitor the relative drift and adjust the conversion of the source signal to track the sink rate.

Figure 1:
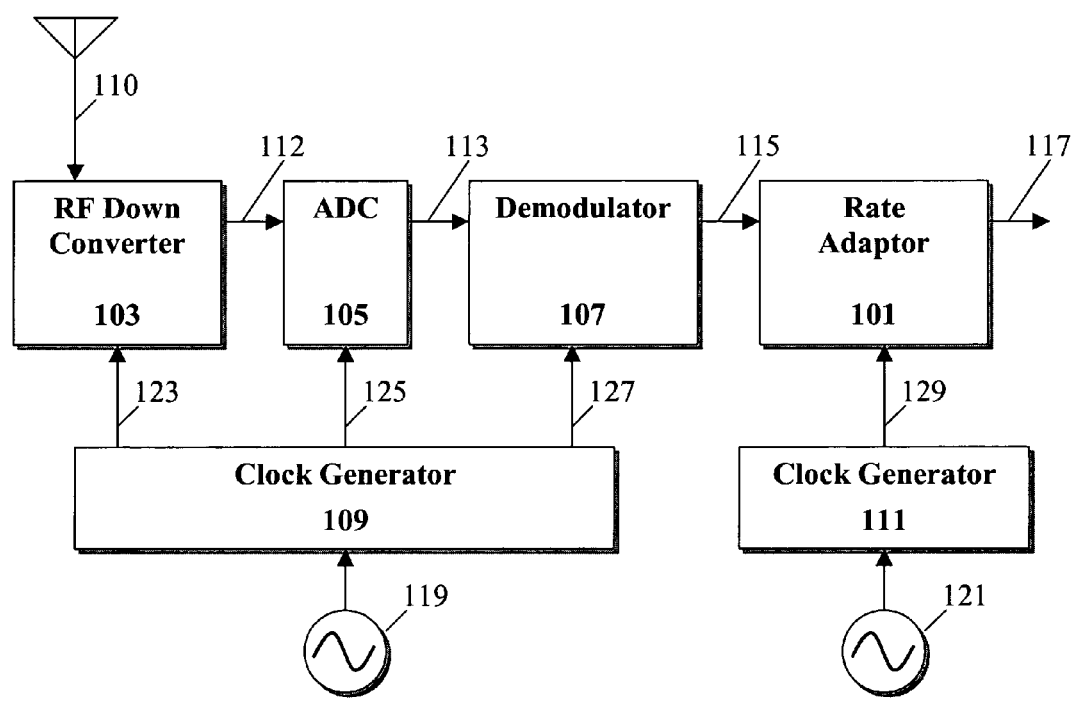
FIG. 1 is a block diagram of an exemplary application comprising a Rate Adapter for sample rate conversion in accordance with an embodiment of the present invention.

FIG. 1 is a block diagram of an exemplary application comprising a Rate Adapter 101 for sample rate conversion in accordance with an embodiment of the present invention. Referring to FIG. 1, the system comprises the Rate Adapter 101, an RF Down Converter 103, an analog to digital converter (ADC) 105, a demodulator 107, two oscillators 119 and 121, and two clock generators 109 and 111.

Rate Adapter 101 may comprise suitable logic, circuitry and/or code that may be adapted to perform sample rate conversion from a source rate to a sink rate and maintain a relatively constant sink rate regardless of a change in the source rate.

The RF Down Converter 103 may comprise analog circuitry, such as filters, amplifiers, and oscillators, that mixes an RF signal down to a baseband signal or an IF signal.

The analog to digital converter (ADC) 105 may comprise circuitry that converts an analog signal into discrete digital logic levels. The analog signal may be centered at baseband or at an IF frequency. Sigma delta modulation may be employed in the ADC circuitry.

The demodulator 107 may comprise digital signal processing techniques that convert a modulated signal into symbols. Additionally, the demodulator 107 may perform digital down conversion from an IF frequency.

Each of the two oscillators 119 and 121 may comprise a master clock for a portion of the system. Each of the two clock generators 109 and 111 may comprise interpolation and decimation logic to convert a master clock into one or more secondary clocks. The ratio of a master clock to a secondary clock may be constant.

In operation, an RF signal 110 is converted to an analog IF signal 112. The analog IF signal 112 is digitized by the ADC 105 to produce a digital IF signal 113, and the digital IF signal 113 is converted to a digital baseband signal 115 by the demodulator 107. A receiver front-end comprising blocks 103, 105, and 107 may be controlled by clock signals 123, 125, and 127 created by a first clock generator 109 based on a first oscillator 119.

In the exemplary embodiment of FIG. 1, the sample rate of the digital baseband signal 115 is converted to a new sample rate to provide a digital output sequence 117 that is compatible with additional processing. A second oscillator 121 may drive the Rate Adapter 101 and the additional processing based on clocks, for example, clock 129 created by the second clock generator 111. Having more than one oscillator in a system may allow for the independent tuning of one oscillator without affecting the other oscillator, for example, to match changing RF signal frequencies. More than one oscillator may also be required in chips that integrate multiple features onto the same die.

Figure 2:
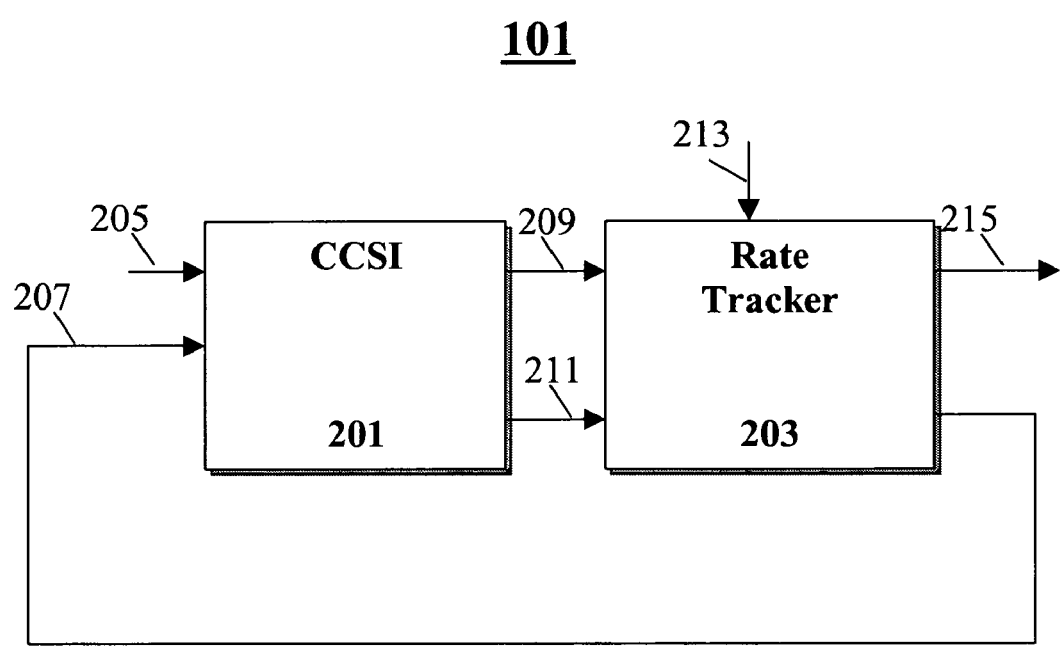
FIG. 2 is a block diagram of the Rate Adapter of FIG. 1, in accordance with an embodiment of the present invention.

FIG. 2 is a block diagram of a Rate Adapter 101 in accordance with an embodiment of the present invention. The Rate Adaptor 101 comprises a Clamped Cubic Spline Interpolator (CCSI) 201 and a Rate Tracker 203.

The Clamped Cubic Spline Interpolator (CCSI) 201 may comprise circuitry for generating interpolated samples based on coefficients that are generated from source samples and estimates of source derivatives. The CSSI 201 is described in further detail with reference to FIG. 3, FIG. 4, FIG. 5, FIG. 6, and FIG. 7. The CCSI may receive a source signal 205 and a conversion ratio 207 and generates a set of interpolated samples 209 and a WRITE clock 211. The source signal 205 may be the digital baseband signal 115 described in FIG. 1 or any digitally sampled signal. The write clock 211 is synchronized to the rate at which the interpolated samples are generated.

The Rate Tracker 203 may comprise logic and memory that provides an interface between interpolated samples and the sink signal. The Rate Tracker 203 is described in further detail with reference to FIG. 8, FIG. 9, and FIG. 10. The Rate Tracker 203 may be adapted to receive the set of interpolated samples 209, the WRITE clock 211, and a READ clock 213 and generates a sink signal 215 and the conversion ratio 207. The READ clock 213 may be the clock 129 described in FIG. 1 or any clock that is based on the sink rate.

The conversion ratio 207 is the ratio of the source rate to the sink rate and may comprise an integer portion and a fractional portion.

Figure 3:
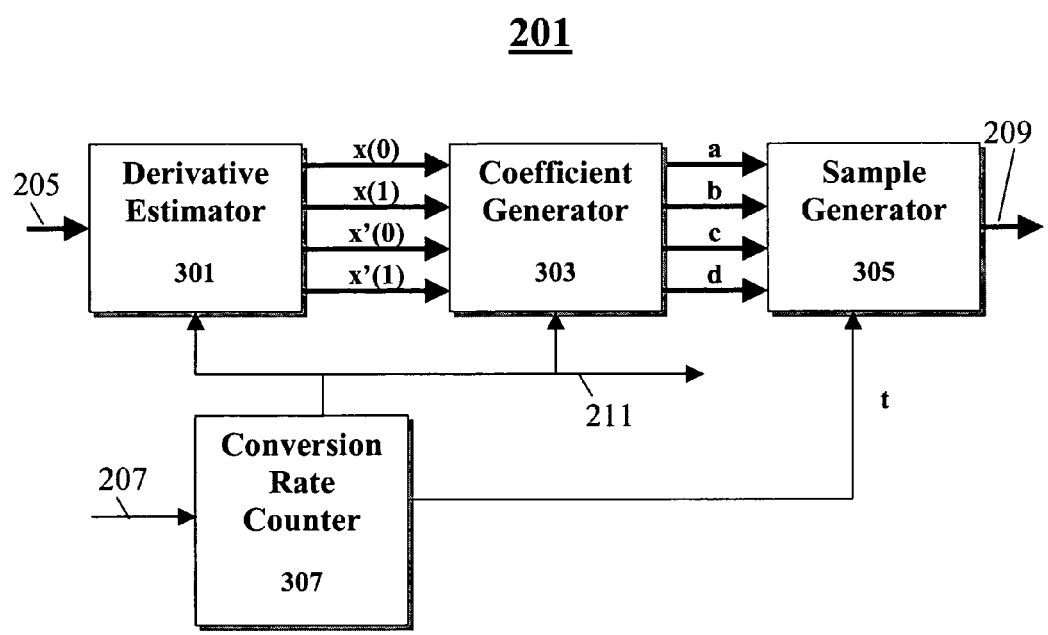
FIG. 3 is a functional block diagram that illustrates an exemplary embodiment of the clamped cubic spline interpolator of FIG. 2, in accordance with an embodiment of the present invention.

FIG. 3 is a functional block diagram that illustrates an exemplary embodiment of the clamped cubic spline interpolator (CCSI) 201 of FIG. 2, in accordance with an embodiment of the present invention. The CCSI 201 comprises a Derivative Estimator 301, a Coefficient Generator 303, a Sample Generator 305, and a Conversion Rate Counter 307.

The sample generator 305 may comprise suitable logic, circuitry and/or code that may be adapted to generate an interpolated sample based on source samples, derivative estimates, and an interpolation time. The sample generator 305 is described in further detail with reference to FIG. 4.

The coefficient generator 303 may comprise suitable logic, circuitry and/or code that may be adapted to generate polynomial coefficients for interpolation based on source samples and derivative estimates. The coefficient generator 303 is described in further detail with reference to FIG. 5.

The derivative estimator 301 may comprise suitable logic, circuitry and/or code that may be adapted to estimate a derivative of the source signal based on two or more source samples. The derivative estimator 301 is described in further detail with reference to FIG. 6.

The conversion rate counter 307 may comprise suitable logic, circuitry and/or code that may be adapted to trigger the generation of interpolated samples and provide the interpolation time. The conversion rate counter 307 is described in further detail with reference to FIG. 7.

The CCSI 201 is coupled to receive the source signal 205 that may be decimated or interpolated by a specified integer or non-integer amount.

Figure 4:
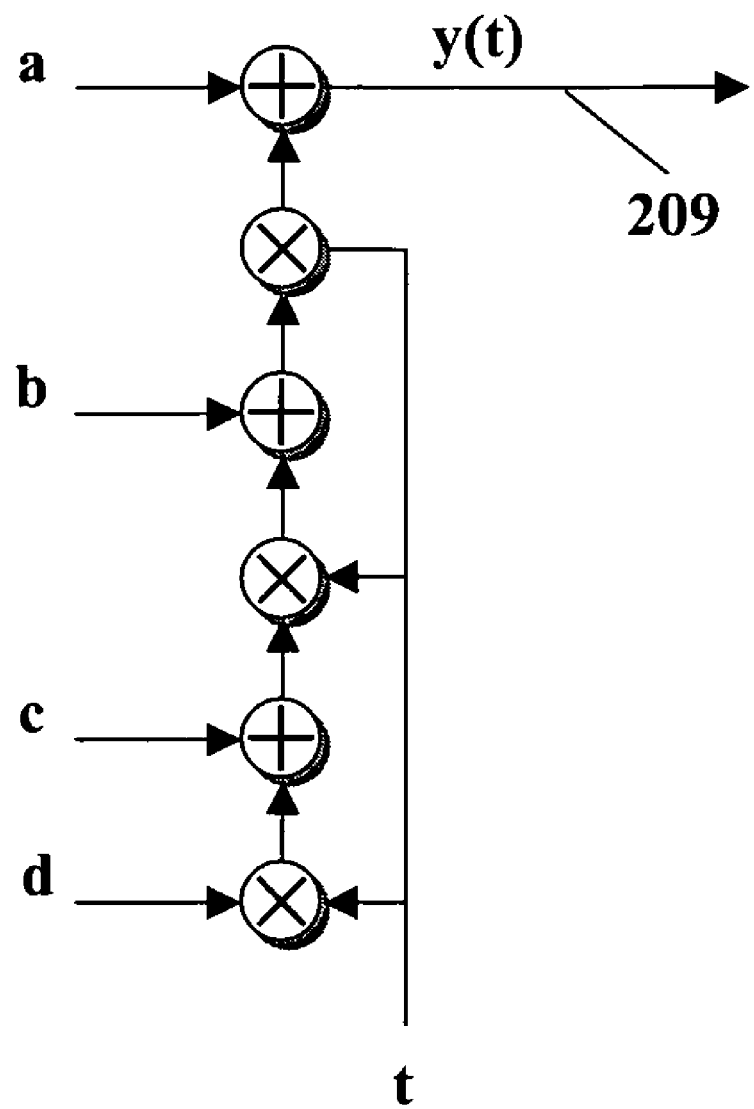
FIG. 4 is a functional block diagram of the sample generator of FIG. 3, in accordance with an embodiment of the present invention.

FIG. 4 is a functional block diagram of the Sample Generator 305 of FIG. 3, in accordance with an embodiment of the present invention. The Sample Generator 305 utilizes four coefficient values, a, b, c, and d, to produce an interpolated sample y(t) 209 at a specified sampling point t. A clamped cubic spline is a cubic polynomial of the form:

$$y(t)=a+b*t+c*t^2+d*t^3,$$

where the coefficients a, b, c, and d depend upon known values of y and y' at boundary points, and where the interpolation point t is in-between the boundary points.

The method of polynomial evaluation adopted here is referred to as Horner's method, that is:

$$y(t)=a+t*(b+t*(c+d*t))$$

The advantages of Horner's method are a reduced number of multiplications necessary to evaluate the polynomial and typically more well balanced intermediate results.

Figure 5:
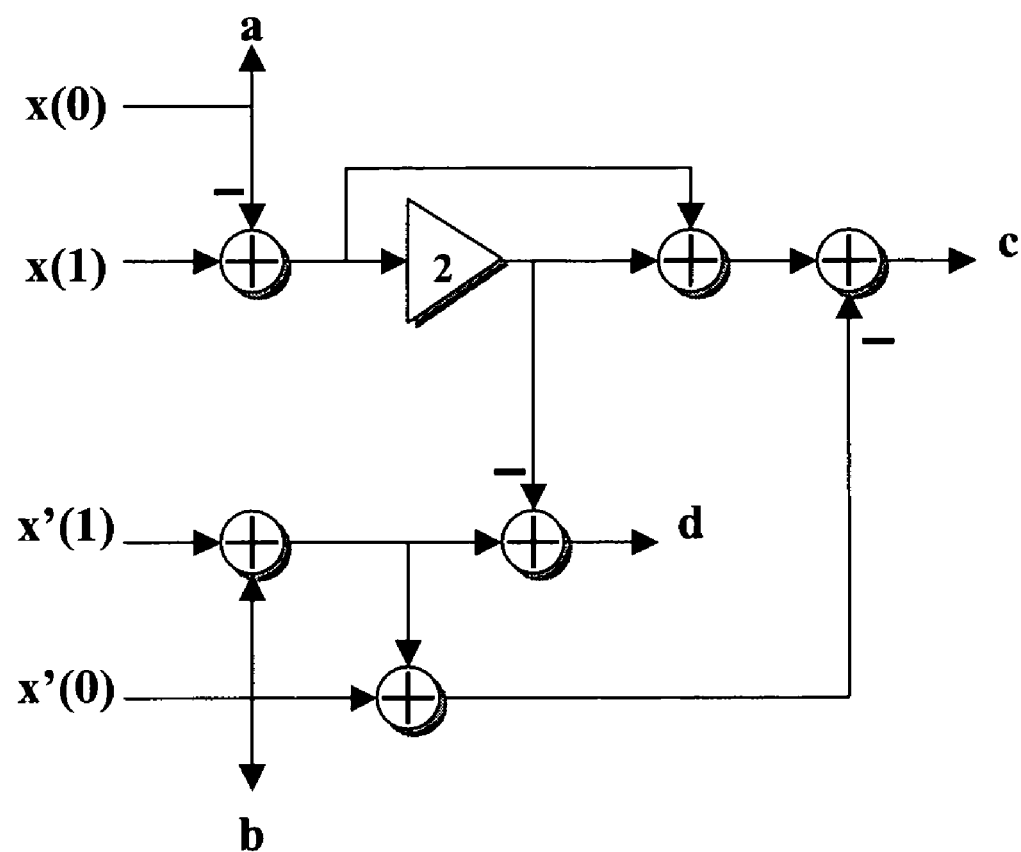
FIG. 5 is a functional block diagram of the coefficient generator of FIG. 3, in accordance with an embodiment of the present invention.

FIG. 5 is a functional block diagram of the Coefficient Generator 303 of FIG. 3, in accordance with an embodiment of the present invention. Two samples of the source signal, x(0) and x(1), and two derivative estimates, x'(0) and x'(1), are utilized to produce the four coefficient values, a, b, c, and d, for the cubic polynomial.

The boundary conditions that generate a, b, c, and d are 1) the sink signal and the source signal are equal at the edges of the boundary:

$$x(0)=y(0)$$

$$x(1)=y(1)$$

and 2) the derivative of the sink signal is equal to the derivative of the source signal at the edges of the boundary:

$$x'(0)=y'(0)$$

$$x'(1)=y'(1)$$

With these conditions, the coefficients are derived:

$$x(0)=y(0)=a$$

$$x(1)=y(1)=a+b+c+d$$

$$x'(0)=y'(0)=b$$

$$x'(1)=y'(1)=b+2c+3d$$

$$c=(2+1)\,[-x(0)+x(1)]-[2x'(0)+x'(1)]$$

$$d=-2[-x(0)+x(1)]+[x'(0)+x'(1)]$$

Figure 6:
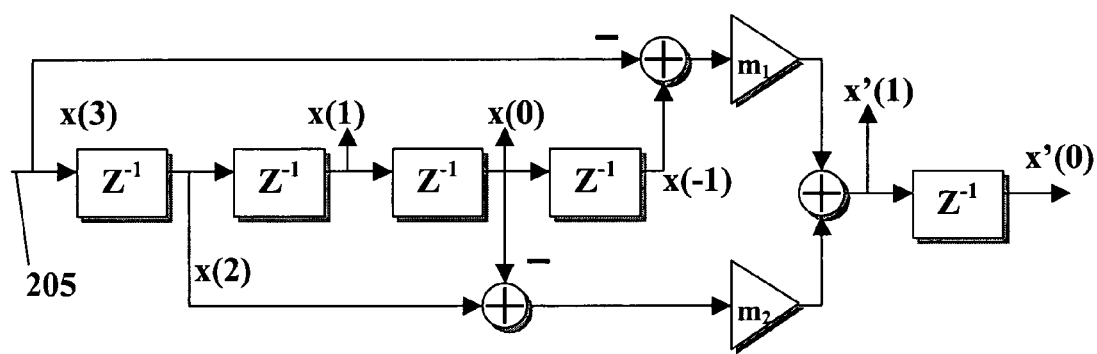
FIG. 6 is a functional block diagram of the derivative estimator of FIG. 3, in accordance with an embodiment of the present invention.

FIG. 6 is a functional block diagram of the Derivative Estimator 301 of FIG. 3, in accordance with an embodiment of the present invention. The Derivative Estimator 301 receives the source signal 205 that is sampled at the source rate. A plurality of samples is captured in parallel. More specifically, a tapped delay line may capture 5 sequential samples x(−1), x(0), x(1), x(2), and x(3) at the source rate. The Derivative Estimator 301 produces two derivative estimates, x'(0) and x'(1) based on the samples in the tapped delay line.

In the present application the signal is generally unknown and hence the derivatives of the signal are not known analytically a-priori. Thus, for high performance applications, precise estimates of the signal derivatives in the boundary points must be generated. The illustrated technique for estimating the derivative utilizes a 5-point estimator. A derivative may be estimated by more than 5 samples or less than 5 samples according to a desired accuracy or an acceptable level of error. Utilizing Taylor series approximation:

$$x'(0)=[x(-2)-8x(-1)+8x(1)-x(2)]/12$$

$$x'(1)=[x(-1)-8x(0)+8x(2)-x(3)]/12$$

The 5-point estimator results in a Signal to Noise and Distortion Ratio (SNDR) of greater than 80 dB. For a larger SNDR, more source samples may be included in the derivative approximation.

The Derivative Estimator 301 may be clocked at an average rate of twice the sink rate to generate two derivative estimates x'(0) and x'(1) every cycle.

Figure 7:
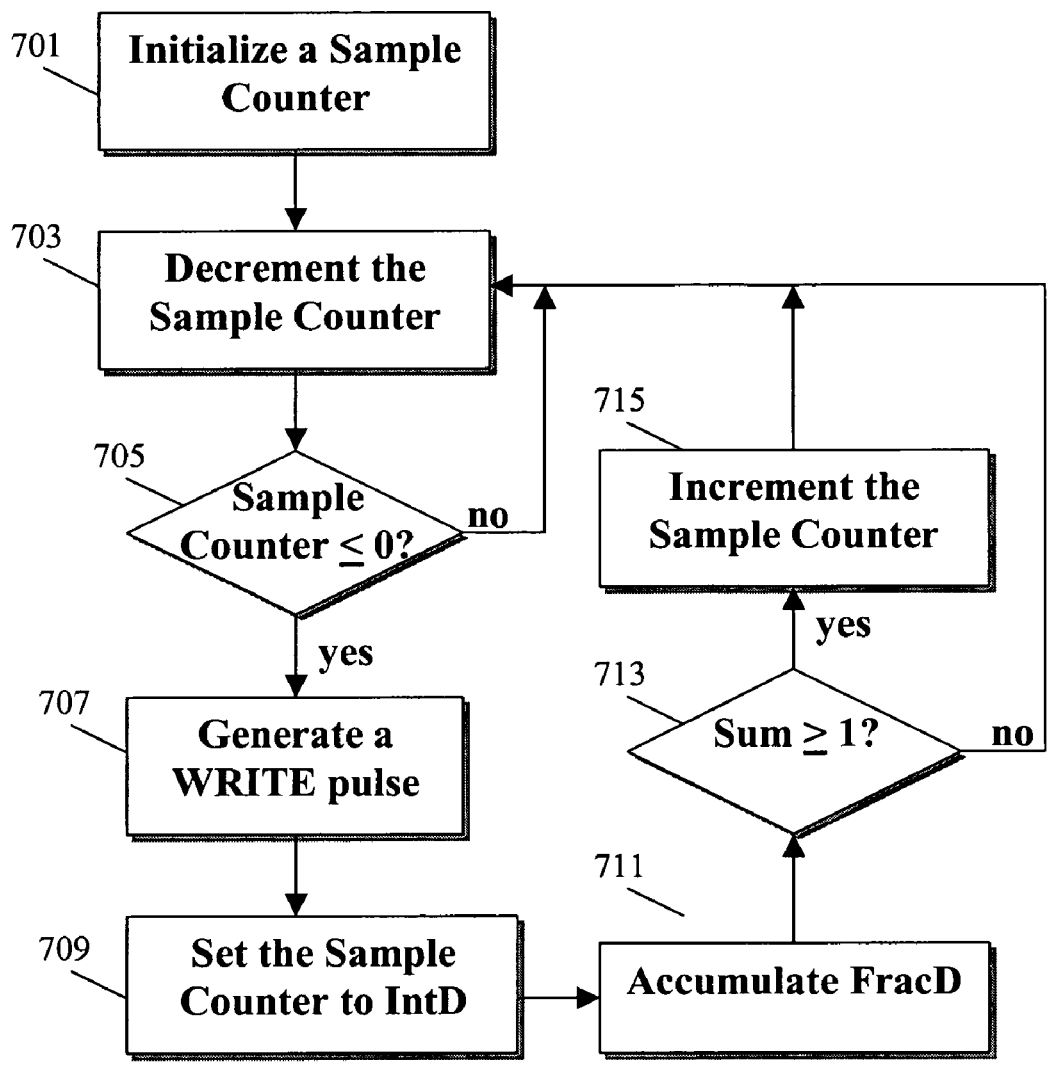
FIG. 7 is a flow diagram of the method used in the conversion rate counter of FIG. 3, in accordance with an embodiment of the present invention.

FIG. 7 is a flow diagram of the method used in the Conversion Rate counter 307 of FIG. 3, in accordance with an embodiment of the present invention. The order in which the following tasks are executed may change without departing from the method.

An integer sample counter, int_reg, is initialized at 701. The initial value of int_reg may be set to any integer value. A larger initial value may introduce a start-up delay. At 703, int_reg is decremented. At 705, int_reg is compared to zero. If int_reg is greater than zero, the process returns to 703.

A Conversion Ratio may be written as a sum of an integer number and a fractional number (i.e. Conversion Ratio=IntD+FracD, where FracD<1). The Conversion Rate Counter 307 is provided with the parameters IntD and FracD. If int_reg is less than or equal to zero, a WRITE pulse is generated at 707, int_reg is set to IntD at 709, FracD is accumulated at 711, and a new output sample may be calculated.

A separate register, frac_reg, accumulates the value FracD modulo 1. The interpolation time-point, t, equals frac_reg, thus no accumulation of quantization noise occurs over time. Prior to the modulo 1 operation, the accumulated sum of FracD is compared to 1 at 713. If the addition of FracD to frac_reg creates a sum that is greater than or equal to 1, the sample counter, int_reg, is incremented by one prior to the return to 703.

When the source rate is greater than the sink rate, IntD will be greater than or equal to 1 and the samples output from Interpolator 209 will be at a decimated rate. Therefore, the rate at which the sample counter is decremented 703 may be based on the source rate. At least one new source sample is input for every new sink sample.

When the source rate is less than the sink rate, IntD will be 0 and the samples output from Interpolator 209 will be at an interpolated rate. The rate at which the sample counter is decremented 703 may be greater than the source rate. Consecutive sink samples may not require a new source sample to be input.

Figure 8:
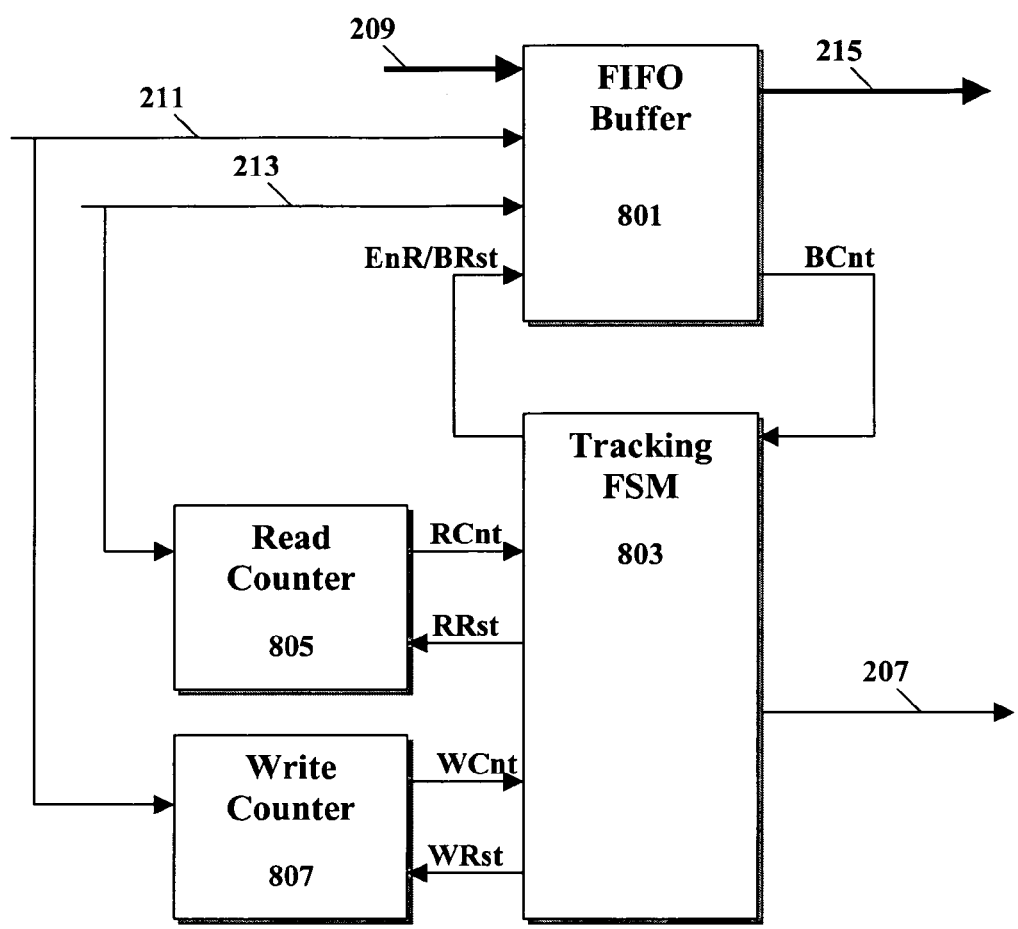
FIG. 8 is a functional block diagram that illustrates a rate tracker in accordance with an embodiment of the present invention.

FIG. 8 is a functional block diagram that illustrates the Rate Tracker 203 in accordance with an embodiment of the present invention. The Rate Tracker 203 comprises a FIFO buffer 801, a Tracking FSM 803, a Read Counter 805, and a Write Counter 807. The Tracking FSM 803 provides logic, circuitry and/or code for initializing the FIFO buffer 801, operating in steady state, monitoring for under/overflow of the FIFO buffer 801, and adapting the rate of the interpolated samples with respect to the sink rate. The Tracking FSM 803 is described in further detail with reference to FIG. 9. The Write Counter 807 provides logic, circuitry and/or code for incrementing a count every time a sample enters the FIFO buffer 801. The Read Counter 805 provides logic, circuitry and/or code for incrementing a count every time a sample leaves the FIFO buffer 801.

The READ Count (RCnt) is incremented in the Read Counter 805 based on the READ signal 213 that may be provided externally. The WRITE Count (WCnt) is incremented in the Write Counter 807 based on the WRITE signal 211 that is provided by the CCSI 201. The READ Count (RCnt) and the WRITE Count WCnt may be reset from the Tracking FSM 803 by asserting RRst and WRst respectively.

The Rate Tracker 203 may track the relative drift that may exist between two clock domains. The first-in-first-out (FIFO) buffer 801 functions as a gate between the two domains. For example, the sink rate may drift to a slower rate, but the sink signal 215 does not immediately accept a data sample that is added at the current conversion rate. The data sample may wait for some period of time and the Tracking Finite State Machine (FSM) 803 may balance the READ and the WRITE signals through control of the Conversion Ratio 207.

During normal operation, interpolated samples are input in such a way that the FIFO buffer 801 remains balanced and never completely empties out or never completely fills up. However, a mode is provided for monitoring the fullness of the buffer (BCnt) and detecting catastrophic imbalance between the READ signal and the WRITE signal. The buffer may be reset, for example BRst=1, if the FIFO buffer experiences an underflow or overflow.

The blocks described in FIG. 3 and FIG. 8 may be modified to process source signals comprising multiple signal paths. For example by duplicating the derivative estimator 301, the coefficient generator 303, the sample generator 305, and the FIFO buffer 801, the rate of a right signal and a left signal in a stereo pair may be converted simultaneously.

Figure 9:
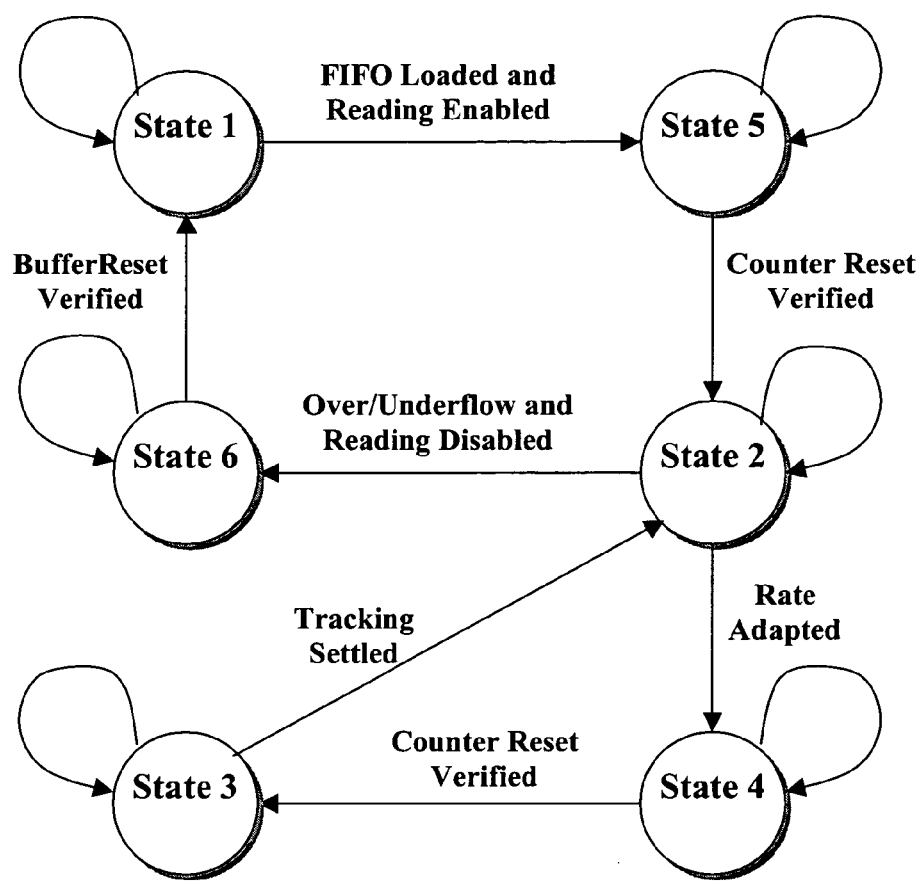
FIG. 9 is a functional block diagram that illustrates a tracking finite state machine in accordance with an embodiment of the present invention.

FIG. 9 is a functional block diagram that further illustrates the details of the Tracking FSM 803 in accordance with an embodiment of the present invention. The Tracking FSM 803 may be implemented in 6 states. It should be apparent that states may be subdivided or combined without departing from the scope of the Tracking FSM 803.

In state 1, the FIFO buffer 801 is loaded and reading from the FIFO buffer 801 is enabled. The read enable signal, EnR, may be asserted, for example EnR=1, to read from the FIFO buffer 801. The FIFO buffer 801 may be filled partially to allow for a rate difference between the READ rate and WRITE rate. For example, a steady state condition for the FIFO buffer 801 may be half full. The READ counter 805 and WRITE counter 807 are reset by asserting a read reset signal (RRst=1) and a write reset signal (WRst=1), for example, RRst=1 and WRst=1, respectively. In state 5, the resetting of read count (RCnt) and the write count (WCnt) is verified.

State 2 is the steady state condition for the Tracking FSM 803. When a condition creates an overflow or underflow in the FIFO buffer 801, state 6 is entered. When the sink rate and source rate appear to drift with respect to one another, the rate is adapted, and then, state 4 is entered. Rate adaptation is discussed in further detail with reference to FIG. 10.

Upon entering state 6, reading has been disabled. Once it is verified that the FIFO buffer 801 has been cleared, state 1 is reentered. Disabling the reading by deasserting the signal EnR, for example EnR=0 and clearing the FIFO buffer 801 by asserting a buffer reset signal BRst, for example BRst=1 may occur simultaneously.

Prior to entering state 4, the READ counter 805 and WRITE counter 807 are reset by asserting the signals RRst and WRst, for example RRst=1 and WRst=1, for example. When the resetting of read count (RCnt) and write count (WCnt) is verified, a transition from state 4 to state 3 occurs. In state 3, a settling time may be allowed. During the settling period before reentering state 2, reading and writing to the FIFO buffer 801 may occur, but monitoring for overflow, underflow, and rate drift is postponed.

Figure 10:
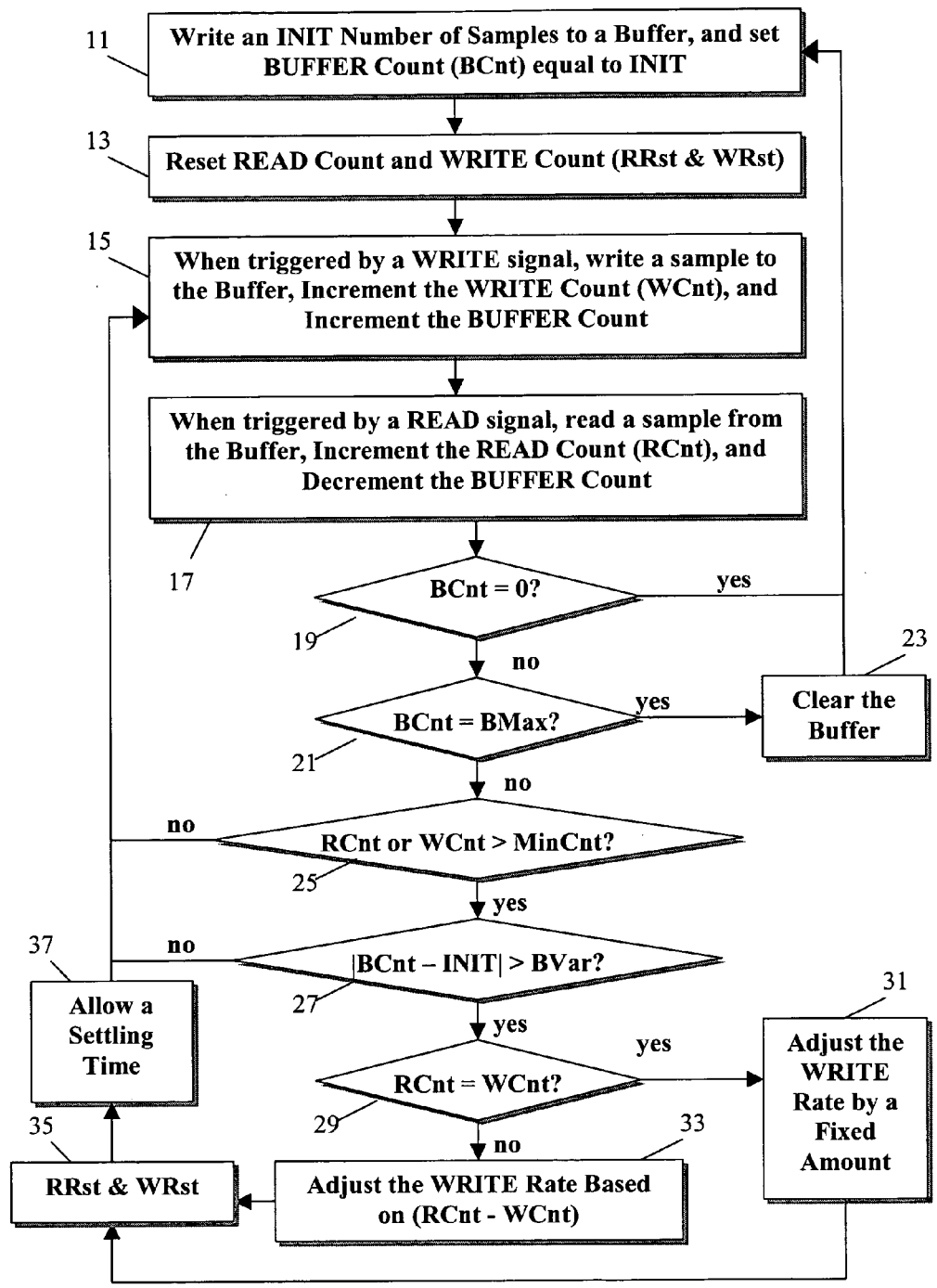
FIG. 10 is a flow chart describing a method for sample rate adaptation in accordance with an embodiment of the present invention.

FIG. 10 is a flow chart describing a method for sample rate adaptation in accordance with an embodiment of the present invention.

In 11, an initial number of samples (INIT) is written to a buffer, and a buffer count (BCnt) may be set equal to INIT. In 13, READ Count (RCnt) is reset (RRst=1), and WRITE Count (WCnt) is reset (WRst=1).

The Rate Tracking algorithm then enters steady state operation. When triggered by a WRITE signal in 15, a sample is written to the buffer, the write count WCnt is incremented by 1, and the buffer count BCnt is incremented by 1. When triggered by a READ signal in 17, a sample is read from the buffer, the read count RCnt is incremented by 1, and BCnt is decremented by 1.

If, at any time, the FIFO buffer overflows or underflows, the FSM enters a reset mode where the buffer is cleared and may be filled up with the initial number of samples, for example halfway, before tracking resumes. Checking for catastrophic failure occurs in 19 and 21. If the buffer count BCnt=0 in 19, the buffer is empty and processing returns to 11. If the buffer count BCnt is equal to Bmax in 21, the buffer is full, the buffer is then cleared in 23, and processing returns to 11.

When the read count RCnt and/or the write count (WCnt) exceed a minimum count (MinCnt) in 25, checking for relative sample rate drift may occur in 27 and 29. The minimum count threshold may prevent rate conversion from toggling too fast. When the absolute difference between the current occupied buffer size and the initial fullness of the buffer (|BCnt−INIT|) exceeds a predetermined margin (Bvar), the write and read rates are determined to be drifting apart and the read count RCnt is compared to the write count (WCnt) in 29. If read count RCnt equals the write count (WCnt) in 29, the write rate is adjusted by a fixed amount in 31. If the read count RCnt does not equal the write count WCnt in 29, the write rate is adjusted by an amount based on the difference (RCnt−WCnt) in 33.

The Conversion Ratio is initialized according to the known ratio of source rate to sink rate, $F_{source}/F_{sink}$, (e.g., 348 kHz/48 kHz=7.25). The tracking rate change may be proportional to the instantaneous rate difference between source and sink, as measured by the counters. If there is no difference between the read count (RCnt) and the write count (WCnt):

$$\text{Correction} = 1 \pm 2^{-N}$$

If there is a difference between the read count (RCnt) and the write count (WCnt):

$$\text{Correction} = 1 + \alpha(\text{WCnt}-\text{RCnt})/\text{RCnt or}$$

Where the tracking rate change damping factor is $\alpha$. The tracking algorithm may be an integral regulator, and a hysteresis may be provided for the tracking algorithm. The minimum tracking change step size may be $1/2^N$.

Once an adjustment to the write rate has occurred, RCnt may be reset (RRst=1) in 35, the write count (WCnt) may be reset (WRst=1) in 35, and a settling time may be allowed in 37. The hysteresis may be set to a fixed count (MinCnt) and/or set based on the count, RCnt or WCnt, reached at the time rate adjustment occurs.

There is an overlap between the affects of the damping factor ($\alpha$), the tracking standby count (previous value of RCnt or WCnt), and the minimum count (MinCnt). They all provide for a settling of this feedback regulator by slowing down the feedback loop. If the minimum (MinCnt) is very low, the regulator will react very quickly to imbalances in the buffer after initialization, and the rate conversion ratio will quickly change.

The embodiments described herein may be implemented as a board level product, as a single chip, application specific integrated circuit (ASIC), or with varying levels of a processing circuit integrated with other portions of the system as separate components. An integrated circuit may store digital data in memory and use an arithmetic logic circuit to perform rate adaptation.

The degree of integration of the sample rate processing circuit will primarily be determined by the speed and cost considerations. Because of the sophisticated nature of modern processors, it is possible to utilize a commercially available processor, which may be implemented external to an ASIC implementation.

If the processor is available as an ASIC core or logic block, then the commercially available processor may be implemented as part of an ASIC device wherein certain functions may be implemented in firmware as instructions stored in a memory. Alternatively, the functions may be implemented as hardware accelerator units controlled by the processor.

While the present invention has been described with reference to certain embodiments, it will be understood by those skilled in the art that various changes may be made and equivalents may be substituted without departing from the scope of the present invention.

Additionally, many modifications may be made to adapt a particular situation or material to the teachings of the present invention without departing from its scope. For example, the invention may be applied to digital sample rate conversion associated with a wide variety of digital processing.

Therefore, it is intended that the present invention not be limited to the particular embodiment disclosed, but that the present invention will include all embodiments falling within the scope of the appended claims.

The invention claimed is:

1. A system for sample rate conversion, the system comprising:
   an interpolator that generates a plurality of interpolated samples from a digital data sequence, wherein the digital data sequence comprises a source rate; and
   a buffer for receiving interpolated samples at a conversion rate and outputs interpolated samples at a sink rate, wherein a ratio of the source rate to the conversion rate is adjustable;
   a steady state circuit that generates a set of counters based on the receiving of interpolated samples by the buffer and the outputting of interpolated samples from the buffer;
   a monitoring circuit that detects whether the buffer is full or empty; and
   a rate adaptation circuit that adjusts the ratio based on a number of interpolated samples in the buffer and the set of counters.

2. The system of claim 1, wherein the change in the source rate is relative to the sink rate.

3. The system of claim 2, further comprising:
   a first oscillator that generates a first clock at the source rate; and
   a second oscillator that generates a second clock at the sink rate.

4. The system of claim 2, wherein the ratio is greater than one and results in decimation of samples going from the source rate to the sink rate.

5. The system of claim 2, wherein the ratio is less than one and results in interpolation of samples going from the source rate to the sink rate.

6. The system of claim 1, wherein the digital data sequence further comprises parallel paths, and wherein the interpolator and buffer simultaneously process a pair of interpolated samples based on the parallel paths.

7. The system of claim 1, wherein the interpolator is a clamped cubic spline interpolator.

8. The system of claim 7, wherein the clamped cubic spline interpolator comprises:
   a derivative estimator that generates derivative estimates of the digital data sequence;
   a coefficient generator that generates coefficient values of a cubic polynomial based on the derivative estimates and samples of the digital data sequence;
   a conversion rate counter that generates a clock at the conversion rate and an interpolation sample time; and
   a sample generator that produces the plurality of interpolated samples based upon the derivative estimates, the coefficient values, and the interpolation sample time, wherein the sample generator is triggered by the clock.

9. The system of claim 1, wherein the rate adaptation circuit further comprises a programmable hysteresis that controls a feedback during the adjusting of the ratio.

10. A method for sample rate conversion, the method comprising:
    generating a plurality of interpolated samples from a digital data sequence, wherein the digital data sequence comprises a source rate; and
    receiving interpolated samples at a conversion rate, wherein a ratio of the source rate to the conversion rate is adjustable;
    outputting interpolated samples at a sink rate;
    generating a set of counters based on the receiving of interpolated samples by the buffer and the outputting of interpolated samples from the buffer;
    detecting whether the buffer is full or empty; and
    adjusting the ratio based on a number of interpolated samples in the buffer and the set of counters.

11. The method of claim 10, wherein the change in the source rate is relative to the sink rate.

12. The method of claim 11, further comprising:
    generating a first clock at the source rate; and
    generating a second clock at the sink rate.

13. The method of claim 11, wherein the ratio is greater than one and going from the source rate to the sink rate results in decimation of samples.

14. The method of claim 11, wherein the ratio is less than one and going from the source rate to the sink rate results in interpolation of samples.

15. The method of claim 10, wherein the digital data sequence further comprises parallel paths, and wherein a pair of interpolated samples is generated based on the parallel paths.

16. The method of claim 10, wherein generating the interpolated samples utilizes clamped cubic spline interpolation.

17. The method of claim 16, wherein the clamped cubic spline interpolation comprises:
    generating derivative estimates of the digital data sequence;
    generating coefficient values of a cubic polynomial based on the derivative estimates and samples of the digital data sequence;
    generating a clock at the conversion rate;
    generating an interpolation sample time; and
    producing the plurality of interpolated samples based upon the derivative estimates, the coefficient values, and the interpolation sample time, wherein the interpolated sample generator is triggered by the clock.

18. The method of claim 10, further comprising controlling feedback during the adjusting of the ratio via a programmable hysteresis.

19. A communication device comprising:
    an integrated circuit comprising:
       an first circuit that generates a plurality of interpolated samples from a digital data sequence, wherein the digital data sequence comprises a source rate;
       a buffer that receives interpolated samples at a conversion rate and outputting interpolated samples at a sink rate, wherein a ratio of the source rate to the conversion rate is adjustable;
       a steady state circuit that generates a set of counters based on the receiving of interpolated samples by the buffer and the outputting of interpolated samples from the buffer;
       a monitoring circuit that detects whether the buffer is full or empty; and
       a rate adaptation circuit that adjusts the ratio based on a number of interpolated samples in the buffer and the set of counters.

* * * * *